United States Patent [19]
Naglich et al.

[11] Patent Number: 6,160,402
[45] Date of Patent: Dec. 12, 2000

[54] METHOD AND APPARATUS FOR DETERMINING CONTACT RESISTANCE

[75] Inventors: Michael Mark Naglich, Elgin; Scott Joseph Ohnemus, Streamwood; Rolf Ernst Kowalewski, Palatine, all of Ill.

[73] Assignee: Motorola, Inc., Schaumburg, Ill.

[21] Appl. No.: 09/141,831

[22] Filed: Aug. 28, 1998

[51] Int. Cl.[7] .................................. G01R 31/02
[52] U.S. Cl. ........................................... 324/421
[58] Field of Search ........................ 324/421, 713, 324/754, 722

[56] References Cited

U.S. PATENT DOCUMENTS

| | | | |
|---|---|---|---|
| 3,996,514 | 12/1976 | Brown et al. | 324/722 |
| 4,175,253 | 11/1979 | Pitegoff. | |
| 4,491,797 | 1/1985 | Velsher | 324/421 |
| 4,835,465 | 5/1989 | Gergin | 324/754 |
| 5,057,772 | 10/1991 | Bruno et al. . | |
| 5,221,905 | 6/1993 | Bhangu et al. | 324/713 |
| 5,365,180 | 11/1994 | Edelman . | |

*Primary Examiner*—Safet Metjahic
*Assistant Examiner*—James C Kerveros
*Attorney, Agent, or Firm*—Kenneth A. Haas

[57] ABSTRACT

A method and apparatus for determining contact resistance (107) includes pressing a lead connector (105) to make a first contact with a metallic pad (103) and an isolated contact with an isolated metallic pad (108) located adjacent to metallic pad (103). Once the first and isolated contacts are formed, the method includes flowing electrical current at a predetermined level through the isolated contact. With the aid of a volt meter (110), voltage differential across the isolated contact is measured while the electrical current at the predetermined level is flowing through the isolated contact. The contact resistance (107) of the first contact is determined based on information obtained from the voltage differential measured across the isolated contact and the predetermined level of the electrical current. Furthermore, the contact force created at the first contact is determined based on the contact resistance (107).

16 Claims, 2 Drawing Sheets

METHOD AND APPARATUS FOR DETERMINING CONTACT RESISTANCE

FIELD OF THE INVENTION

The present invention relates to the field of manufacturing and testing electrical circuits.

BACKGROUND OF THE INVENTION

Contact resistance of a contact between a lead connector and a metallic pad on a printed circuit board becomes very important when high level of electrical current flows through the contact. High level of electrical current normally is experienced in operation of power amplifiers. Such power amplifiers are found in wireless telecommunication devices. When the contact resistance is high, the resistance causes a substantial voltage drop across the contact. More importantly, excessive contact resistance causes heat to generate in the contact area which often times causes equipment failure. The level of contact resistance is unpredictable due to variations of the contact force between the lead connector and the metallic pad. The metallic pad and the lead may be connected via a screw. The contact resistance is depended on how tight the screw is turned. If the screw, or similar clamping device, is used to clamp a heat sink to a power device for heat sinking application, it is important that the screw is adequately clamping the heat sink to the power device.

When electrical circuits are manufactured and tested in a factory, the contact resistance, or contact force, is very often overlooked. As a result, a printed circuit board after being placed in operation may fail due to high contact resistance. Therefore, there is a need for a method and apparatus for determining contact resistance of a contact in an electrical circuit.

DETAILED DESCRIPTION OF THE PREFERRED EMBODIMENT(S)

A method for determining contact resistance includes pressing a lead connector to make a first contact with a metallic pad and an isolated contact with an isolated metallic pad located adjacent to the metallic pad. Once the first and isolated contacts are formed, the method includes flowing electrical current at a predetermined level through the isolated contact. With the aid of a volt meter, the voltage differential across the isolated contact is measured while the electrical current at the predetermined level is flowing through the isolated contact. The contact resistance of the first contact is determined based on information obtained from the voltage differential measured across the isolated contact and the predetermined level of the electrical current. The contact resistances of the isolated contact and the first contact are correlated since the metallic pads forming parts of the contacts are located adjacent to each other. As a result, a correlation factor may be necessary to determine the contact resistance of the first contact based on information obtained about current and voltage associated with the isolated contact.

The electrical current flowing through the isolated contact may be direct electrical current or a pulse of electrical current. In the case of using a pulse of electrical current, the voltage differential across the isolated contact may be determined with the aid of an oscilloscope or a similar device. The voltage amplitude of a pulse of signal created across the isolated contact determines the isolated contact resistance which is proportional to the contact resistance of the first contact.

Very often the contact resistance is correlated with the contact force between the lead connector and the metallic pad or the isolated metallic pad. In that case, the contact force created at the first contact may be determined based on the contact resistance of the first contact. The lead connector may be connected to the metallic pad and the isolated metallic via a screw. Pressing the lead connector to the pads then includes screwing a screw through the lead connector and the metallic and metallic isolated pads to make the first and isolated contacts. The determined contact resistance may similarly be used to determine the contact force, or the clamping force, created by using the screw. Since contact resistance of the first contact is not measured directly, the determined contact resistance may be an approximated contact resistance.

Figure 1:
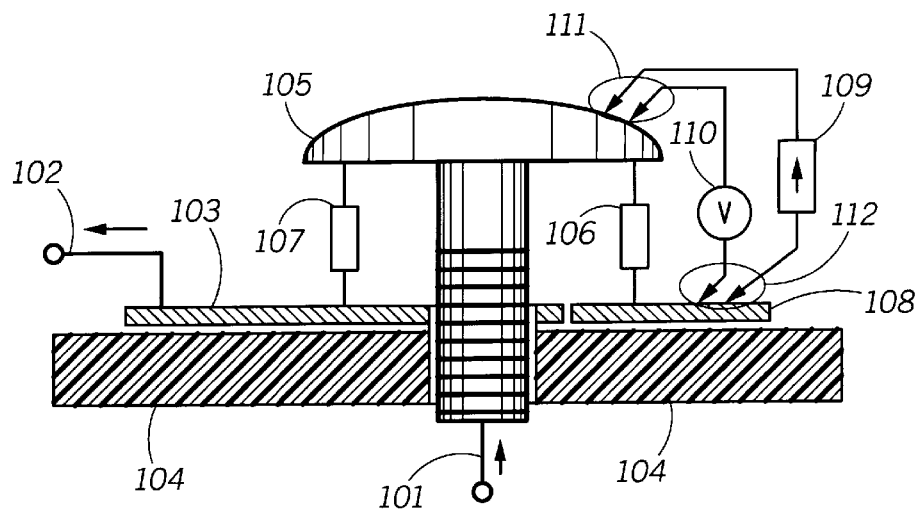
FIG. 1 depicts a block diagram of an apparatus for determining contact resistance.

Referring to FIG. 1, a block diagram of an apparatus for determining contact resistance is shown. A cross section of a printed circuit (PC) board 104 is shown. PC board 104 may have many circuit components and contacts, for simplicity of explanation, only a metallic pad 103 and an isolated metallic pad 108 are shown. Metallic pad 103 is connected to an electrical circuit (not shown) at connections 101 and 102. For example, connection 101 may be connected to a power supply (not shown), and connection 102 connected to a power amplifier (not shown) or any onboard or off board electrical load. For supply of electrical current to the electrical circuit connected at connection 102, electrical current flows through a screw 105 from connection 101 to connection 102. The electrical current flows through a contact resistance 107 which is created between connections 101 and 102 by screw 105 making a contact with metallic pad 103. If, for example, screw 105 is not screwed tightly, contact resistance 107 may become large. For applications that involve high current such as power amplifier applications, an amount of contact resistance of tens of mili-ohms at contact resistance 107 is considered large. Normally, an acceptable resistance is about one tenth of a mili-ohms.

Isolated metallic pad 108 is adjacent to metallic pad 103, and does not directly make an electrical contact with metallic pad 103. Except, when screw 105 is screwed down such that it makes contact with metallic pad 103 and an isolated contact with isolated metallic pad 108, metallic pad 108 and 103 have an indirect connection through screw 105. Since screw 105 makes contact with metallic pad 103 and isolated metallic pad 108 at close proximity, a contact resistance 106 created at the isolated contact is closely correlated to contact resistance 107 created at contact between pad 103 and screw 105. A measurement of contact resistance 106 determines contact resistance 107 without breaking connections 101 and 102. As a result, connection 101 and 102 may remain intact while contact resistance 107 is determined.

To measure contact resistance 107, a current source 109 allows test current to flow at a predetermined level from isolated metallic pad 108 and back through screw 105 and contact resistance 106. Test current that is generated by current source 109 does not flow through connections 101 and 102, contact resistance 107 and metallic pad 103. With the aid of a volt meter 110, or other suitable detectors, the voltage drop across contact resistance 106 is measured. The voltage drop information and the predetermined current level information provides the means to determine contact resistance 106. Since contact resistance 106 and 107 are closely correlated, or proportional, contact resistance 107 is also determined as a result. It may be highly beneficial to have a four-terminal-connections at contacts 111 and 112 while test current flows via current source 109 and volt meter 110 measures voltage drop across contact resistance 106. Four-terminal-connections at contacts 111 and 112 may be of Kelvin Connection type which is known to one ordinary skilled in the art.

Figure 2:
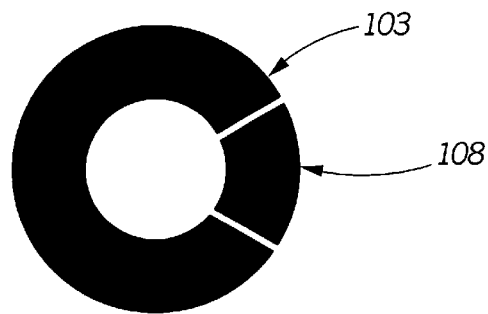
FIG. 2 depicts a top view of a metallic pad and isolated metallic pad.

Referring to FIG. 2, a top view of metallic pad 103 and isolated metallic pad 108 is shown. Although there may be other variations, the top view shows the relationship of pad 103 to 108 with respect to size and proximity. The size of pad 108 is smaller than the size of pad 103.

Figure 3:
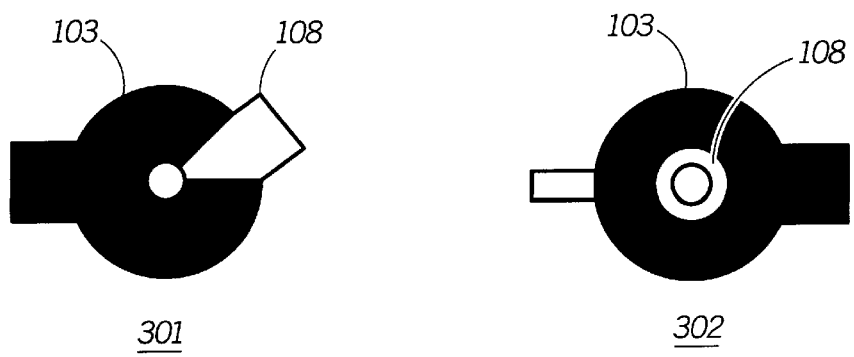
FIG. 3 depicts two variations of the metallic pad and isolated metallic pad.

Referring to FIG. 3, two variations 301 and 302 of the metallic pads 103 and 108 are shown. In variation 301, isolated metallic pad 108 is forming a part of a circle that shapes metallic pad 103. In variation 302, isolated metallic pad 108 is centered within metallic pad 103. In variations 301 and 302, metallic pad 103 does not make an electrical contact with isolated metallic contact 108.

Figure 4:
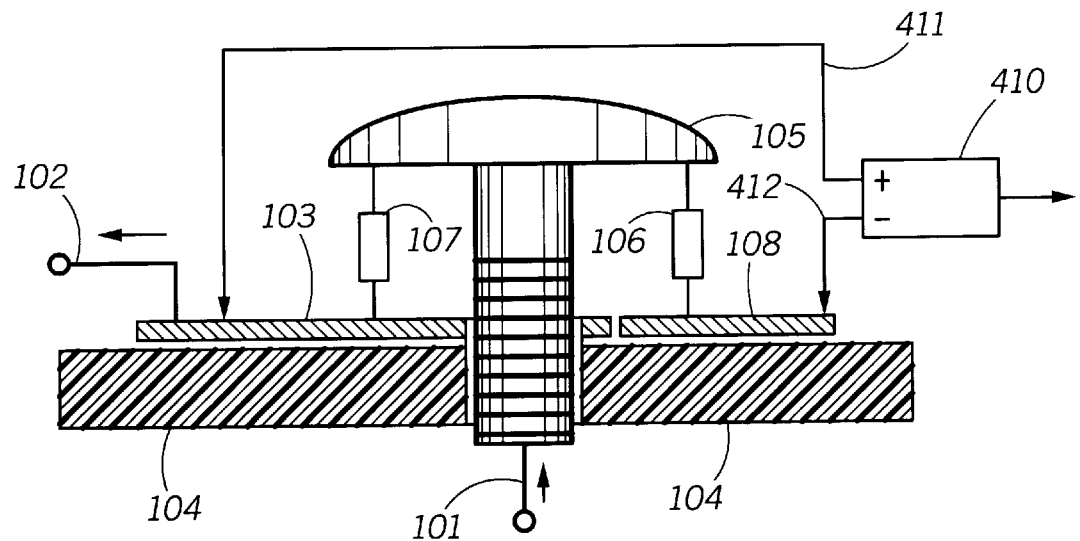
FIG. 4 depicts a block diagram of an apparatus for determining contact resistance while electrical current flows through a circuit connection.

Referring to FIG. 4, according to an advantage of the invention, contact resistance 107 may also be determined while electrical current flows from connection 101 to connection 102. Since isolated metallic pad is not connected to any low input impedance electrical circuit, the current flows from connection 101 to connection 102 through contact resistance 107 without any substantial current flowing through contact resistance 106. As such, if contact resistance 107 gets large, a substantial voltage differential is created between metallic pad 103 and isolated metallic pad 108. A voltage differential detector, or meter, 410, such as one containing a conventional operational amplifier, monitors the voltage differential between metallic pad 103 and isolated metallic pad 108 while connection 102 is connected to an electrical circuit with impedance lower than the impedance of meter 410. The voltage differential is measured via connections 411 and 412. When the voltage differential exceeds a predetermined level, meter 410 indicates that contact resistance 107 has exceeded a predetermined level. This may be due to poor contact between screw 105 and pad 103. Meter 410 may continuously monitor such voltage differential to indicate to an operator or a controlling unit (not shown) that contact resistance 107 has exceeded the predetermined level. Therefore, a corrective measure may be taken before substantial damage takes place or occurs.

Figure 5:
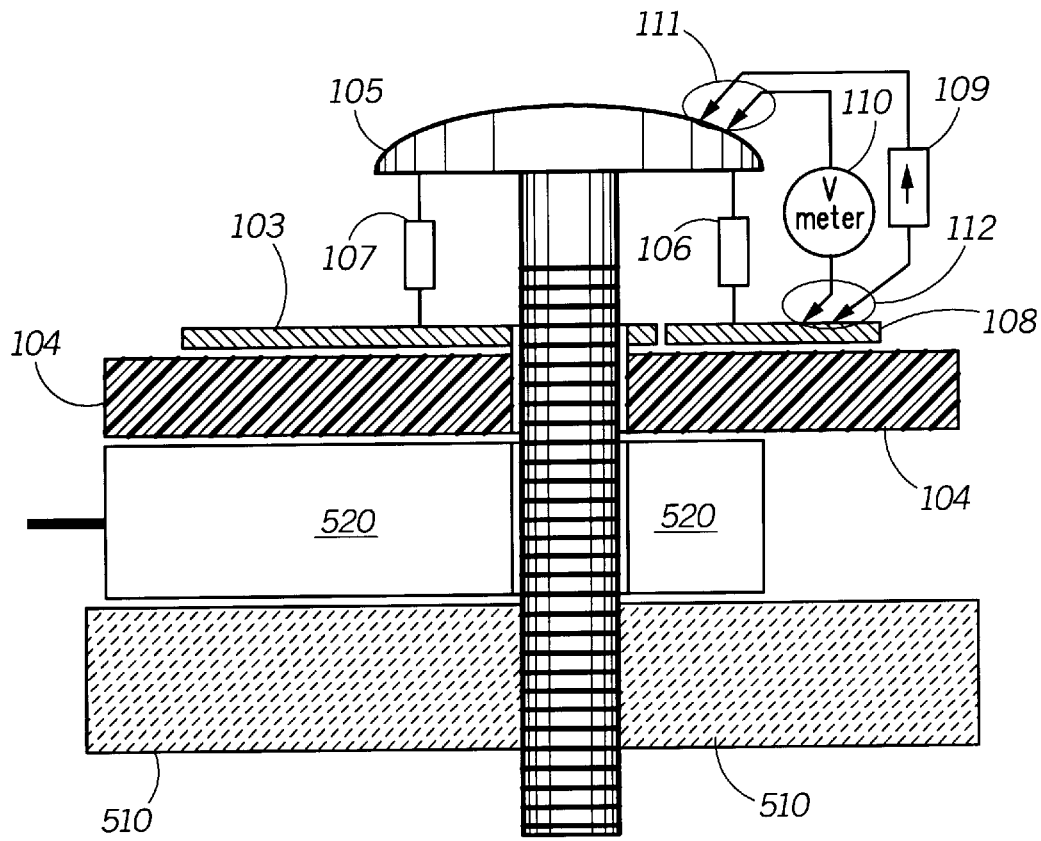
FIG. 5 depicts a block diagram of an apparatus for determining contact resistance in a heat sink application.

Referring to FIG. 5, screw 105 may provide the means for clamping a power device 520 to a heat sink 510 for dissipating heat that may be generated by power device 520 while in operation. Proper heat dissipation requires tight contacts between heat sink 510 and power device 520. Therefore, screw 105 is turned until a tight contact with good clamping force, or contact force, is created between heat sink 510 and power device 520. As a further advantage of the invention, by measuring the voltage differential across contact resistance 106, the contact force between heat sink 510 and power device 520 is determined. Contact resistance 106 correlates with contact resistance 107, even though contact resistance 107 is not measured in this case. Contact resistances 106 and 107 correlate with the clamping force between heat sink 510 and power device 520. However, in this case only contact resistance 106 needs to be determined to find the clamping force. Contact resistance 106 is sampled to determine the total clamping force. The method for measuring contact resistance 106 is explained supra while referring to FIG. 1.

While the invention has been particularly shown and described with reference to a particular embodiment, it will be understood by those skilled in the art that various changes in form and details may be made therein without departing from the spirit and scope of the invention. The corresponding structures, materials, acts and equivalents of all means or step plus function elements in the claims below are intended to include any structure, material, or acts for performing the functions in combination with other claimed elements as specifically claimed.

What is claimed is:

1. A method for determining contact resistance comprising the steps of:

pressing a lead connector onto a substrate to make simultaneous first non-isolated contact with a metallic pad and an isolated contact with an isolated metallic pad located adjacent to said metallic pad, wherein both the metallic pad and the isolated metallic pad are located on the substrate and the lead connector is a clamping device used to clamp a component part to the substrate;

flowing electrical current at a predetermined level through said isolated contact;

measuring voltage differential across said isolated contact; and determining contact resistance of said first contact based on information obtained from said measuring voltage differential and said predetermined level of electrical current.

2. The method as recited in claim 1 wherein said flowing electrical current is flowing direct electrical current.

3. The method as recited in claim 1 wherein said flowing electrical current is flowing a pulse of electrical current.

4. The method as recited in claim 3 wherein said measuring voltage differential includes measuring voltage amplitude of a pulse of signal produced across said isolated contact.

5. The method as recited in claim 1 further comprising the step of determining contact force created at the first contact based on the contact resistance of the first contact, wherein there exists a correlation between the contact force created at the first contact and the contact resistance of the first contact.

6. The method as recited in claim 1 wherein said pressing includes screwing a screw through said lead connector and said metallic and metallic isolated pads to make said first and isolated contacts.

7. A method for determining contact resistance comprising the steps of:

pressing a lead connector onto a substrate to make simultaneous first contact with a metallic pad and an isolated contact with an isolated metallic pad located adjacent to said metallic pad, wherein both the metallic pad and the isolated metallic pad are located on the substrate and the lead connector is a clamping device used to clamp a component part to the substrate;

connecting said metallic pad to an electrical circuit having a finite input flowing electrical current through said connector;

measuring voltage differential between said metallic and isolated metallic pads;

determining contact resistance of said first contact based on information obtained from said measuring voltage differential.

8. The method as recited in claim 7 further comprising the step of determining contact force created at the first contact based on contact resistance of the first contact, wherein there exists a correlation between the contact force created at the first contact and the contact resistance of the first contact.

9. The method as recited in claim 7 wherein said pressing includes screwing a screw through said lead connector and said metallic and isolated metallic pads to make said first and isolated contacts.

10. An apparatus for determining contact resistance comprising:

a first lead connector connected to a metallic pad forming a first contact and simultaneously connected to an isolated metallic pad forming an isolated contact, said isolated metallic pad located adjacent to said metallic pad, wherein both the metallic pad and the isolated metallic pad are located on a substrate and the lead connector is a clamping device used to clamp a component part to the substrate;

means for flowing electrical current at a predetermined level through said isolated contact;

means for measuring voltage differential across said isolated contact; and means for determining contact resistance to determine contact resistance of said first contact based on information obtained from said measuring voltage differential and said predetermined level of electrical current.

11. The method as recited in claim 10 further comprising means for determining contact force created at the first contact based on contact resistance of the first contact, wherein there exists a correlation between the contact force created at the first contact and the contact resistance of the first contact.

12. The method as recited in claim 10 further includes a screw for connecting said lead to said metallic and said isolated metallic pads.

13. The method as recited in claim 10 wherein said means for determining contact resistance is a means for determining approximate contact resistance.

14. An electrical connection comprising:

a first metallic pad existing on a substrate;

a second metallic existing on the substrate pad located adjacent to said first metallic pad;

a lead connector used to clamp a component part to the substrate simultaneously connected to said first metallic pad forming a first connection and to said second metallic pad forming a test connection, wherein electrical current flows only through said first connection when an electrical circuit including said electrical connection is operating normally, and said test connection is used to determine contact resistance of said first connection during operation of said electrical circuit or during assembly of said electrical circuit.

15. The electrical connection as recited in claim 14 wherein said electrical circuit includes a power amplifier.

16. The electrical connection as recited in claim 14 wherein said electrical connection is an electrical ground connection.

\* \* \* \* \*

UNITED STATES PATENT AND TRADEMARK OFFICE
CERTIFICATE OF CORRECTION

PATENT NO. 6,160,402
DATED : December 12, 2000
INVENTOR(S) : Naglich et al.

It is certified that error appears in the above-identified patent and that said Letters Patent is hereby corrected as shown below:

Column 4, line 66, after "input", insert -- impedance; --

Signed and Sealed this

First Day of May, 2001

Attest:

NICHOLAS P. GODICI

Attesting Officer

Acting Director of the United States Patent and Trademark Office